United States Patent
Takagi

(10) Patent No.: US 9,691,865 B2
(45) Date of Patent: Jun. 27, 2017

(54) HIGH FREQUENCY SEMICONDUCTOR DEVICE

(71) Applicant: Kabushiki Kaisha Toshiba, Minato-ku (JP)

(72) Inventor: Kazutaka Takagi, Kawasaki (JP)

(73) Assignee: Kabushiki Kaishi Toshiba, Minato-ku (JP)

( * ) Notice: Subject to any disclaimer, the term of this patent is extended or adjusted under 35 U.S.C. 154(b) by 0 days.

(21) Appl. No.: 15/238,857

(22) Filed: Aug. 17, 2016

(65) Prior Publication Data

US 2017/0062576 A1    Mar. 2, 2017

(30) Foreign Application Priority Data

Aug. 28, 2015    (JP) ................................. 2015-169303

(51) Int. Cl.

| H01L 29/66  | (2006.01) |
| H01L 29/417 | (2006.01) |
| H01L 29/778 | (2006.01) |
| H01L 29/20  | (2006.01) |
| H01L 29/201 | (2006.01) |
| H01L 29/423 | (2006.01) |

(52) U.S. Cl.
CPC ...... H01L 29/41758 (2013.01); H01L 29/201 (2013.01); H01L 29/2003 (2013.01); H01L 29/42316 (2013.01); H01L 29/7786 (2013.01)

(58) Field of Classification Search
CPC ............... H01L 29/0692; H01L 29/812; H01L 29/41758; H01L 29/2008; H01L 29/201; H01L 29/42316; H01L 29/7786

USPC .......................................................... 257/275
See application file for complete search history.

(56) References Cited

U.S. PATENT DOCUMENTS

| 6,713,793 B1 | 3/2004 | Suzuki et al. |
| 8,653,565 B1 | 2/2014 | Vorhaus |
| 2002/0027253 A1* | 3/2002 | Kohno ............... H01L 27/0623 257/370 |
| 2006/0255403 A1* | 11/2006 | Asano ................ H01L 27/0605 257/335 |
| 2012/0228632 A1* | 9/2012 | Takada .............. H01L 21/8213 257/77 |

(Continued)

FOREIGN PATENT DOCUMENTS

| JP | 3-191533 | 8/1991 |
| JP | 2001-28425 | 1/2001 |

(Continued)

*Primary Examiner* — Trung Q Dang
(74) *Attorney, Agent, or Firm* — Oblon, McClelland, Maier & Neustadt, L.L.P.

(57) ABSTRACT

A high frequency semiconductor device includes a stacked body, a gate electrode, a source electrode and a drain electrode. The gate electrode includes a bending gate part and a straight gate part. The bending gate part is extended in a zigzag shape and has first and second outer edges. The source electrode includes a bending source part and a straight source part. The bending source part has an outer edge spaced by a first distance from the first outer edge of the bending gate part along a normal direction. The drain electrode includes a bending drain part and a straight drain part. The bending drain part has an outer edge spaced by a second distance from the second outer edge of the bending gate part along the normal direction.

11 Claims, 8 Drawing Sheets

(56) References Cited

U.S. PATENT DOCUMENTS

2014/0252416 A1 9/2014 Takagi
2016/0056275 A1 2/2016 Takagi

FOREIGN PATENT DOCUMENTS

| JP | 2007-243018 | 9/2007 |
| JP | 2007-274181 | 10/2007 |
| JP | 2008-141055 | 6/2008 |
| JP | 2015-173161 | 10/2015 |

* cited by examiner $$L1 = \frac{J3}{2} + D1 + \frac{J4}{2}$$

HIGH FREQUENCY SEMICONDUCTOR DEVICE

CROSS-REFERENCE TO RELATED APPLICATIONS

This application is based upon and claims the benefit of priority from Japanese Patent Application No. 2015-169303, filed on Aug. 28, 2015; the entire contents of which are incorporated herein by reference.

FIELD

Embodiments described herein relate generally a high frequency semiconductor device.

BACKGROUND

The output power of the field effect transistor used as a high frequency semiconductor device increases in proportion to the gate width. The gate width can be increased by elongating the gate electrode.

However, elongating the gate electrode results in the increase of gate resistance and the increase of phase shift. This decreases the gain. Then, the output power fails to increase in proportion to the gate width. The gate electrode can be elongated per chip length by extending the gate electrode in a zigzag shape. This results in problems, which also include the increase of gate resistance and the increase of phase shift. Then, in this way, the output power also fails to increase in proportion to the gate width.

DETAILED DESCRIPTION

In general, according to one embodiment, a high frequency semiconductor device includes a stacked body, a gate electrode, a source electrode and a drain electrode. The stacked body is made of a compound semiconductor. The gate electrode includes a bending gate part and a straight gate part. The bending gate part is extended in a zigzag shape on a surface of the stacked body and has a first outer edge and a second outer edge on an opposite side of the first outer edge. The straight gate part is extended on parts of a surface of the bending gate part along a first straight line, and connects the parts of the surface in shortcut pass. The source electrode includes a bending source part and a straight source part. The bending source part has an outer edge spaced by a first distance from the first outer edge of the bending gate part along a normal direction and is extended on the surface of the stacked body. The straight source part is extended on parts of a surface of the bending source part in parallel to the first straight line, and connects the parts of the surface in shortcut pass. The drain electrode includes a bending drain part and a straight drain part. The bending drain part has an outer edge spaced by a second distance from the second outer edge of the bending gate part along the normal direction t and is extended on the surface of the stacked body. The straight drain part is extended on parts of a surface of the bending drain part along the first straight line, and connects the parts of the surface in shortcut pass.

Embodiments of the invention will now be described with reference to the drawings.

Figure 1A:
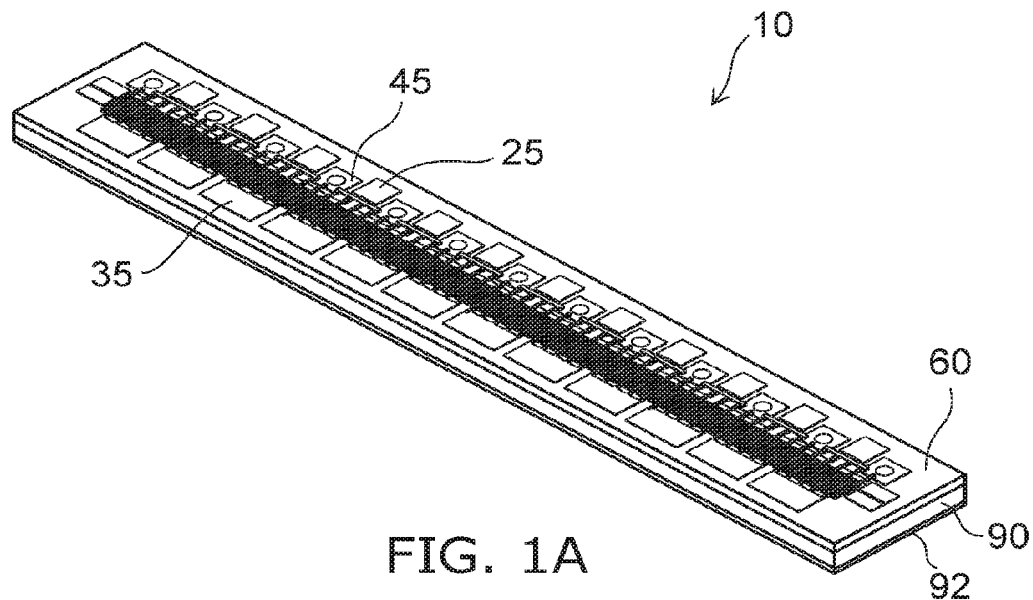
FIG. 1A is a schematic perspective view of a high frequency semiconductor device according to a first embodiment.
Figure 1B:
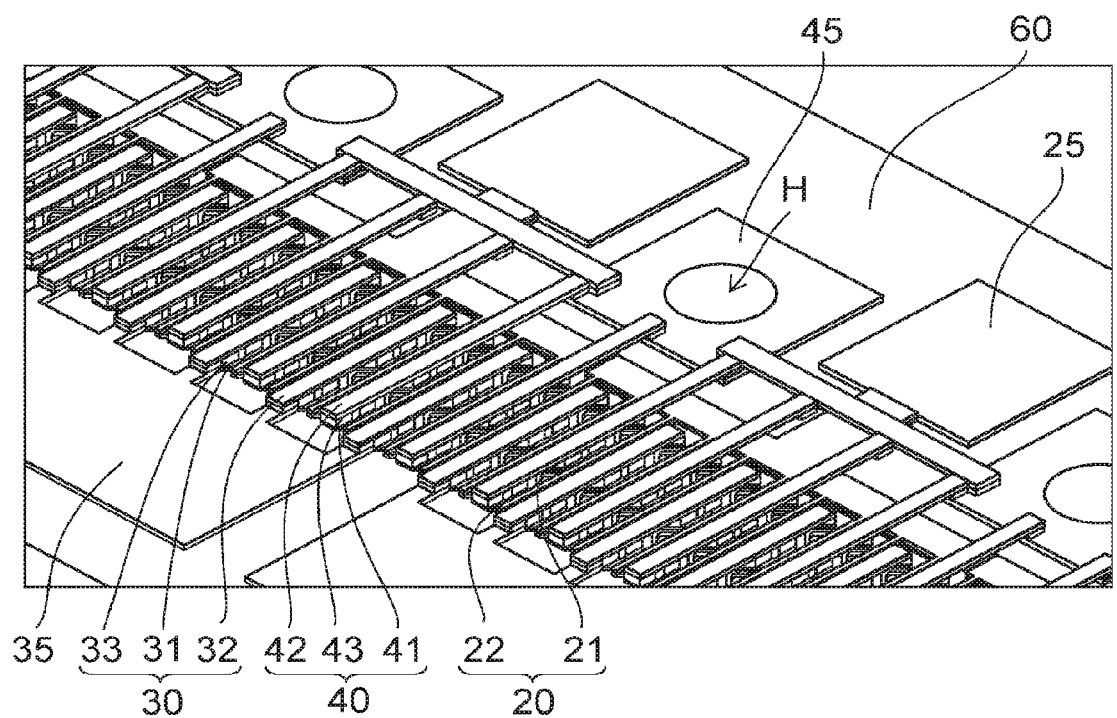
FIG. 1B is a partial enlarged perspective view.

FIG. 1A is a schematic perspective view of a high frequency semiconductor device according to a first embodiment. FIG. 1B is a partial enlarged perspective view thereof.

The high frequency semiconductor device is one of e.g. field effect transistors such as HEMT (high electron mobility transistor) and MESFET (metal semiconductor field effect transistor).

The high frequency semiconductor device 10 includes a stacked body 60, a gate terminal electrode 25, a source terminal electrode 45, and a drain terminal electrode 35.

The stacked body 60 includes a substrate 90 and a channel layer provided on the substrate. A HEMT can be obtained by further providing an electron supply layer on the channel layer. The field effect transistor can be made of e.g. GaN-based material or AlGaAs-based material.

The gate terminal electrode 25 is connected to a finger-shaped gate electrode 20. The gate terminal electrode 25 is connected to an input circuit by e.g. a bonding wire (not shown). The drain terminal electrode 35 is connected to a finger-shaped drain electrode 30. The drain terminal electrode 35 is connected to an output circuit by e.g. a bonding wire (not shown). The source terminal electrode 45 is connected to the rear surface conductor 92 of the substrate 90 through e.g. a through hole. A finger-shaped source electrode 40 is connected to the source terminal electrode 45.

Figure 2A:
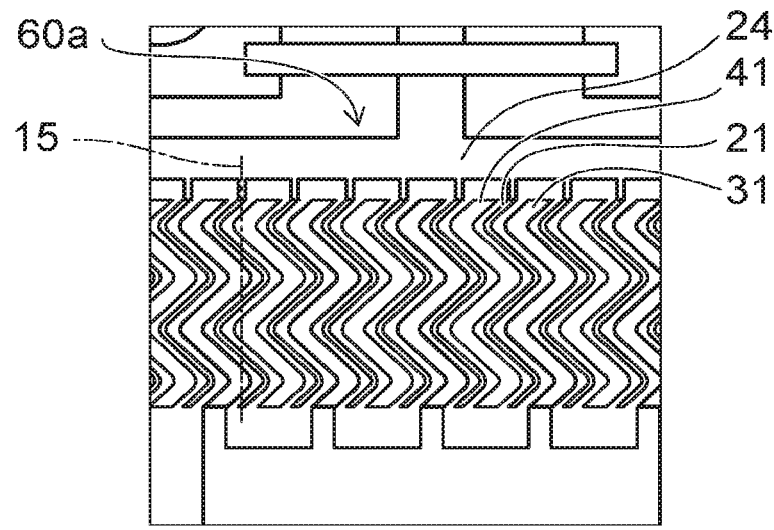
FIG. 2A is a schematic plan view of the bending gate part, the bending source part, and the bending drain part of the high frequency semiconductor device according to the first embodiment.
Figure 2B:
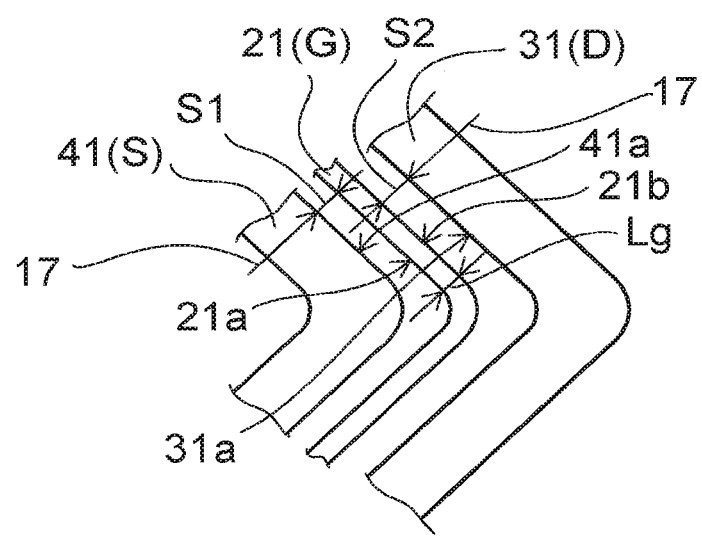
FIG. 2B is a partial enlarged schematic plan view.

FIG. 2A is a schematic plan view of the bending gate part, the bending source part, and the bending drain part of the high frequency semiconductor device according to the first embodiment. FIG. 2B is a partial enlarged schematic plan view thereof. The gate electrode 20 includes a bending gate part 21 and a straight gate part 22. The bending gate part 21 is extended in a zigzag shape on the surface 60a of the stacked body 60 and has a first outer edge 21a and a second outer edge 21b on an opposite side of the first outer edge 21a. The straight gate part 22 is extended on the surface of the bending gate part 21 along a first straight line 15.

As shown in FIG. 2A, the bending gate part 21 is formed by forming e.g. a photoresist pattern on the surface 60a of the stacked body 60 and using e.g. lift-off technique.

The source electrode 40 includes a bending source part 41 and a straight source part 42. The bending source part 41 has an outer edge 41a spaced by a first distance S1 from the first outer edge 21a of the bending gate part 21 along its normal direction 17, as shown in FIG. 2B. The bending source part 41 is extended on the surface 60a of the stacked body 60. The straight source part 42 is extended on the surface of the bending source part 41 in parallel to the first straight line 15, as shown in FIG. 1B.

As shown in FIG. 2A, the bending source part 41 is formed by forming e.g. a photoresist pattern on the surface 60a of the stacked body 60 and using e.g. lift-off technique.

The drain electrode 30 includes a bending drain part 31 and a straight drain part 32. The bending drain part 31 has an outer edge 31a spaced by a second distance S2 from the second outer edge 21b of the bending gate part 21 along the normal direction 17 on an opposite side of the bending source part 41, as shown in FIG. 2B. The bending drain part 31 is extended on the surface 60a of the stacked body 60. The straight drain part 32 is extended on the surface of the bending drain part 31 along the first straight line 15, as shown in FIG. 1B.

As shown in FIG. 2A, the bending drain part 31 is formed by forming e.g. a photoresist pattern on the surface 60a of the stacked body 60 and using e.g. lift-off technique.

Figure 3A:
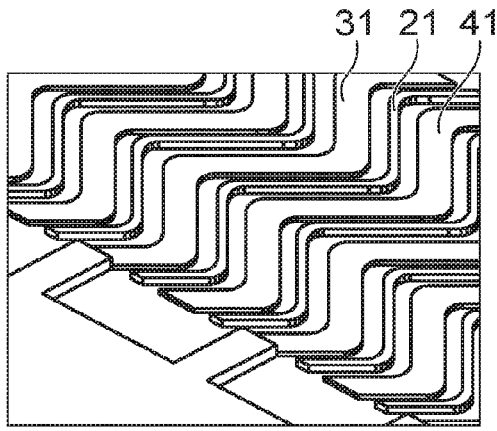
FIG. 3A is a partial enlarged schematic perspective view of the bending gate part, the bending source part, and the bending drain part of the high frequency semiconductor device according to the first embodiment.
Figure 3B:
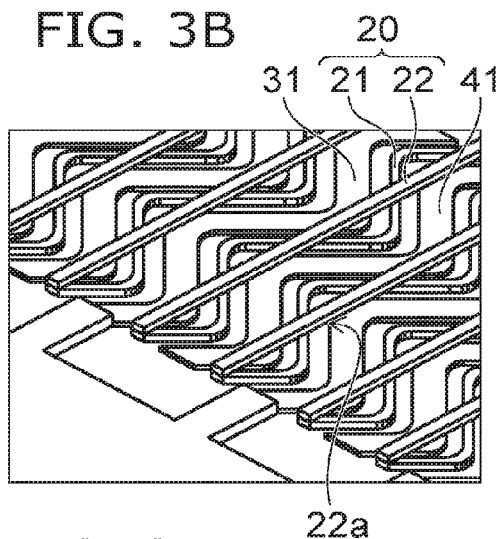
FIG. 3B is a partial enlarged schematic perspective view with the straight gate part.
Figure 3C:
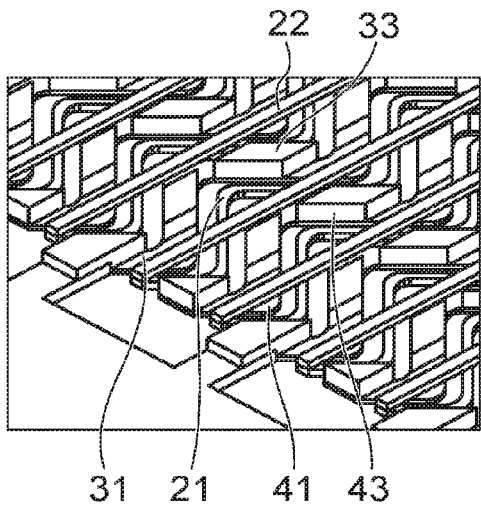
FIG. 3C is a partial enlarged schematic perspective view with spacers.
Figure 3D:
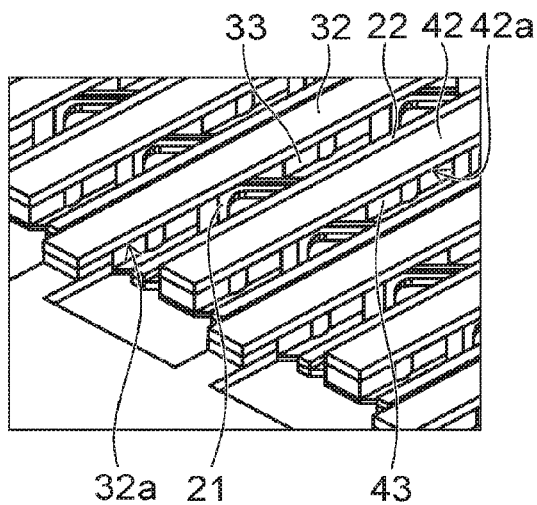
FIG. 3D is a partial enlarged schematic perspective view of with the straight source part and the straight drain part.
Figure 3E:
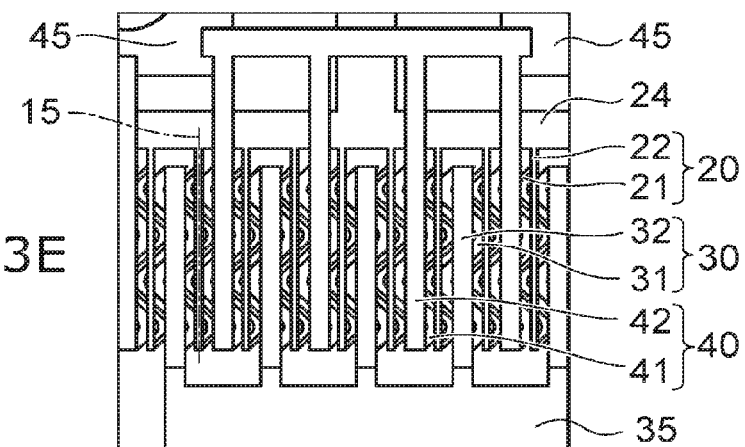
FIG. 3E is a schematic plan view of the gate electrode, the source electrode, and the drain electrode.

FIG. 3A is a partial enlarged schematic perspective view of the bending gate part, the bending source part, and the bending drain part of the high frequency semiconductor device according to the first embodiment. FIG. 3B is a partial enlarged schematic perspective view with the straight gate part. FIG. 3C is a partial enlarged schematic perspective view with the spacers. FIG. 3D is a partial enlarged schematic perspective view with the straight source part and the straight drain part, FIG. 3E is a schematic plan view of the gate electrode, the source electrode, and the drain electrode.

As shown in FIG. 3B, the straight gate part 22 is formed by forming a multilayer photoresist so as to expose only connecting areas of the surface of the bending gate part 21 and using e.g. lift-off technique. The straight source part 42 is formed by forming a multilayer photoresist so as to expose only connecting areas of the surface of the bending source part 41 and using e.g. lift-off technique (FIG. 3C). The straight drain part 32 is formed by forming a multilayer photoresist so as to expose only connecting areas of the surface of the bending drain part 31 and using e.g. lift-off technique (FIG. 3C).

Preferably, the lower surface 42a of the straight source part 42 is made higher than the surface of the bending gate part 21, as shown in FIG. 3D. This can avoid contact between the zigzag-shaped bending gate part 21 and the straight source part 42. In this case, as shown in FIGS. 3C and 3D, a conductive spacer 43 is preferably formed along the first straight line 15 using e.g. lifting technique between the straight source part 42 and the bending source part 41.

The gate electrode 20 may be bundled by a gate bus line 24. In this case, the lower surface 42a of the straight source part 42 is preferably higher than the upper surface of the gate bus line 24. Furthermore, the source electrode 40 and the gate electrode 20 can be three-dimensionally arranged by e.g. a bridge structure.

Preferably, the lower surface 32a of the straight drain part 32 is made higher than the surface of the bending gate part 21. This can avoid contact between the zigzag-shaped bending gate part 21 and the straight drain part 32. In this case, as shown in FIGS. 3C and 3D, a conductive spacer 33 is preferably formed using e.g. lift-off technique between the straight drain part 32 and the bending drain part 31.

As shown in FIG. 3E, the straight gate part 22, the straight source part 42, and the straight drain part 32 are formed.

Figure 4:
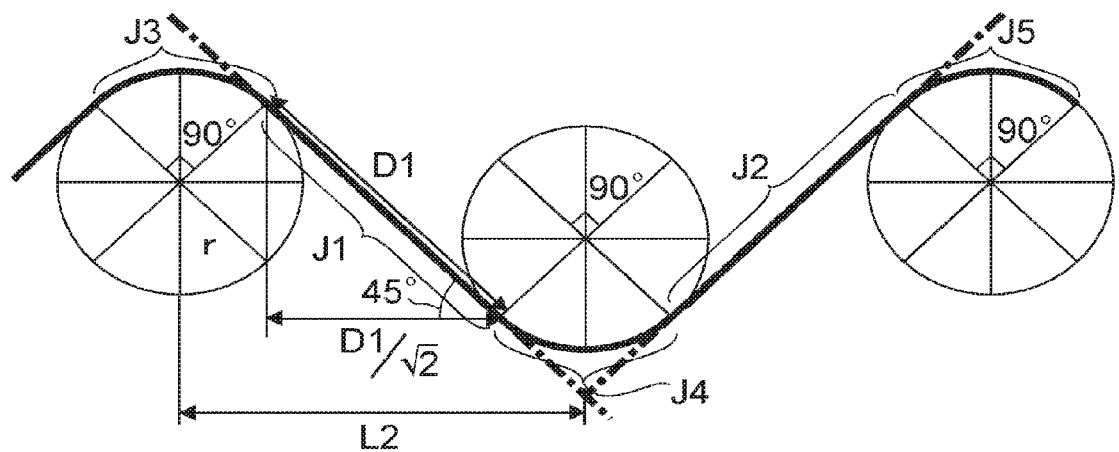
FIG. 4 is a schematic plan view showing an example of the planar shape of the bending gate part.

FIG. 4 is a schematic plan view showing an example of the planar shape of the bending gate part.

The line connecting the center points of the width of the bending gate part 21 includes e.g. two straight regions (having lengths of J1, J2) and curvilinear regions (having lengths of J3, J4, J5). The straight regions of J1, J2 cross the first straight line 15 in a zigzag shape at 45°. The curvilinear region of J3, J4, J5 is provided between the two straight regions. The straight regions of J1, J2 are each provided so as to be in contact with a circle of radius r. The two straight regions of J1, J2 cross each other at 90°.

In this figure, the curvilinear regions of J3-J5 are arc having a central angle of 90°. The length of all the arcs is $\pi r/2$. The straight regions of J1, J2 have an equal length of D1.

The unit length L1 (=J3/2+D1+J4/2) of the line connecting the center points of the width of the bending gate part 21 is given by equation (1).

$$L1 = D1 + \frac{\pi r}{2} \tag{1}$$

If the gate electrode 20 consists only of a straight line, the length L2 in parallel to the first straight line 15 is given by equation (2).

$$L2 = \frac{D1}{\sqrt{2}} + \frac{2r}{\sqrt{2}} \tag{2}$$

The gate width ratio is defined as L1/L2 and given by equation (3).

$$\frac{L1}{L2} = \frac{D1 + \frac{\pi r}{2}}{\frac{D1}{\sqrt{2}} + \frac{2r}{\sqrt{2}}} = \frac{1 + \frac{\pi}{2} \times \frac{r}{D1}}{\frac{1}{\sqrt{2}} + \frac{2}{\sqrt{2}} \times \frac{r}{D1}} \tag{3}$$

In equation (3), when the radius r is made close to 0, the gate width ratio becomes close to 1.414, i.e., the square root of 2.

The straight gate part 22 is provided above the bending gate part 21. This suppresses the resistance increase and the phase shift increase of the gate electrode 20 even if the gate width of the bending gate part 21 is elongated by a factor of e.g. 1.3. This reduces the decrease of gain.

Likewise, this suppresses the resistance increase and the phase shift increase of the drain electrode 30 and the source electrode 40 even if the length of the bending drain part 31 or the bending source part 41 is elongated by a factor of e.g. 1.3. Here, the shape of the curvilinear region is not limited to the arc (or circular ring).

Figure 5A:
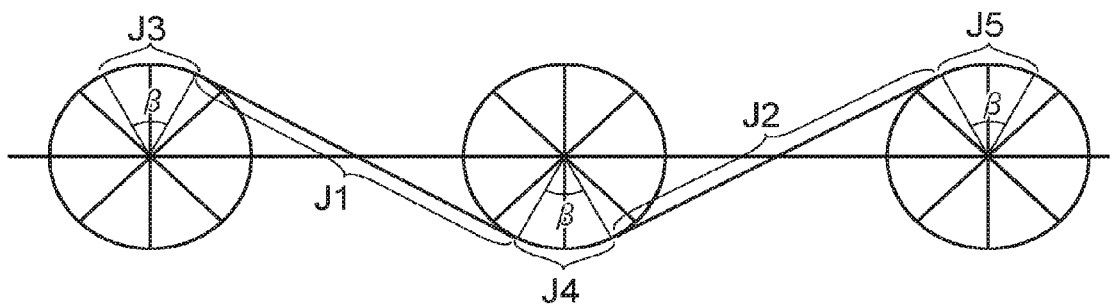
FIG. 5A is a schematic view of a first variation of the bending gate part 21.
Figure 5B:
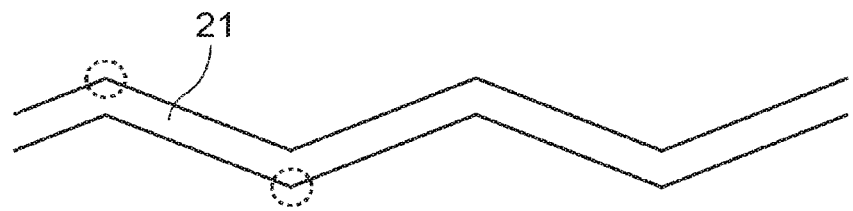
FIG. 5B is a schematic view of a second variation.

FIG. 5A is a schematic view of a first variation of the bending gate part 21. FIG. 5B is a schematic view of a second variation.

As shown in the first variation of FIG. 5A, the center of the circle may be placed on the first straight line 15. The straight regions of J1, J2 are a tangent of the circle. In this figure, the central angle β of the arc-shaped curvilinear regions of J3, J4, J5 is smaller than 90°. In this case, the gate width ratio is smaller than that of the first embodiment shown in FIG. 4.

As shown in the second variation of FIG. 5B, the bending gate part 21 can be shaped like a kinked line. However, if the bending part of the gate electrode 20 has a corner (indicated by a dashed line) in plan view, the electric field concentrates on the corner. Thus, the drain-gate breakdown voltage is lower than the drain-gate breakdown voltage for the planar shape including no corner. More preferably, the corner is rounded. This can increase the breakdown voltage.

Figure 6A:
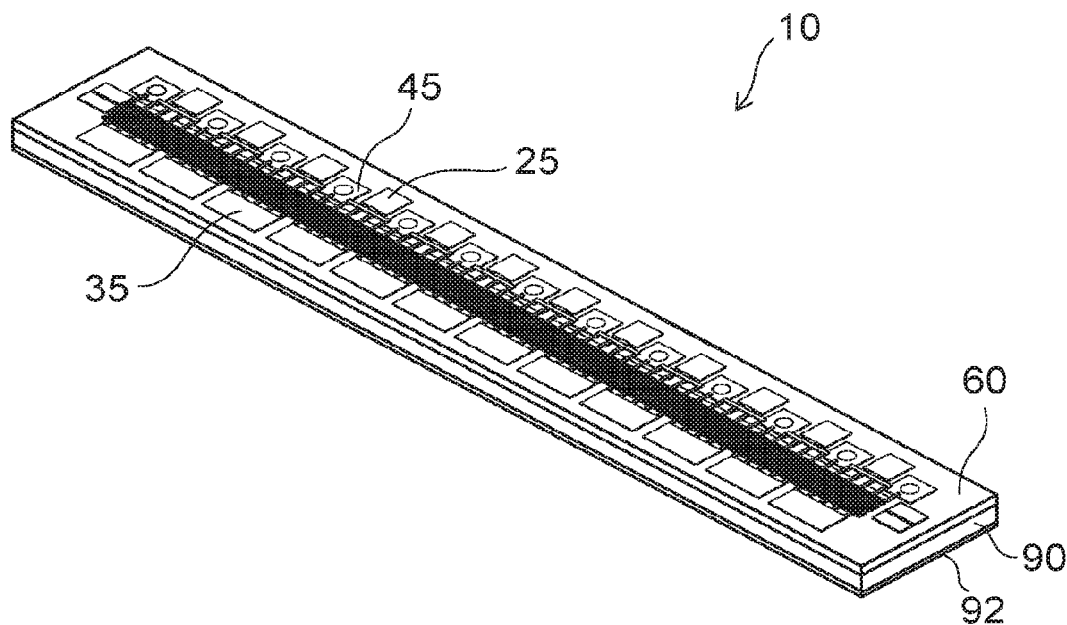
FIG. 6A is a schematic perspective view of a high frequency semiconductor device according to a second embodiment.
Figure 6B:
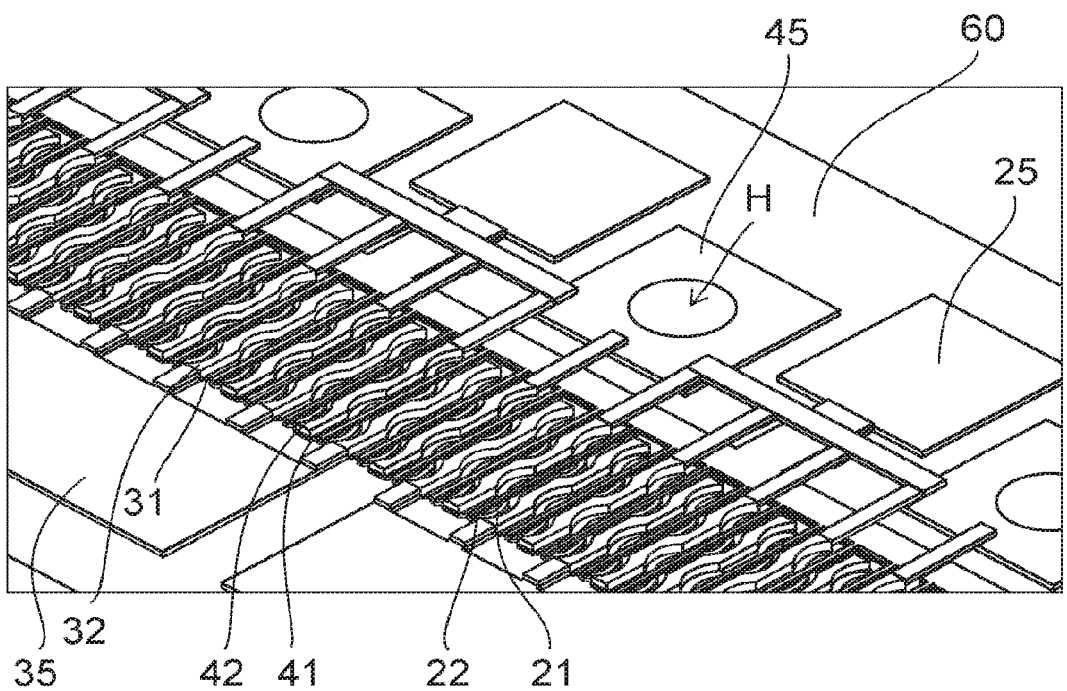
FIG. 6B is a partial enlarged schematic perspective view.

FIG. 6A is a schematic perspective view of a high frequency semiconductor device according to a second embodiment. FIG. 6B is a partial enlarged schematic perspective view thereof.

Figure 7A:
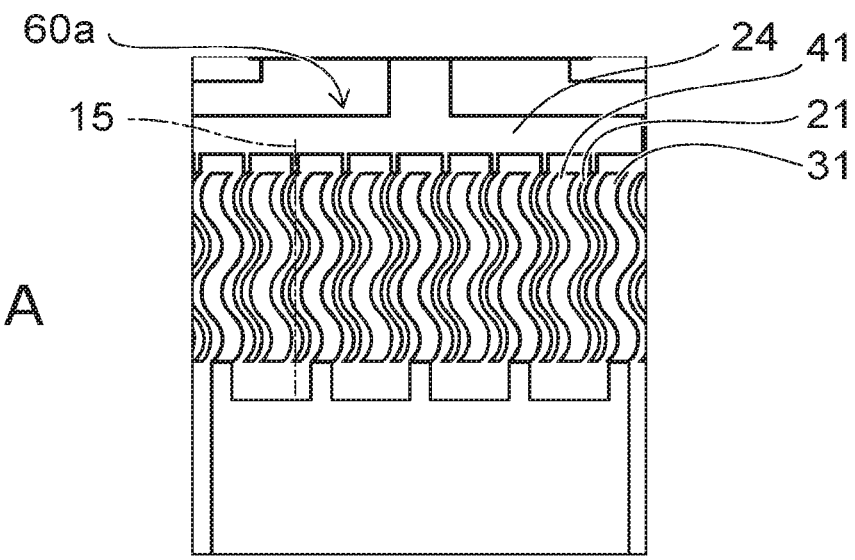
FIG. 7A is a schematic plan view of the bending gate part, the bending source part, and the bending drain part of the high frequency semiconductor device according to the second embodiment.
Figure 7B:
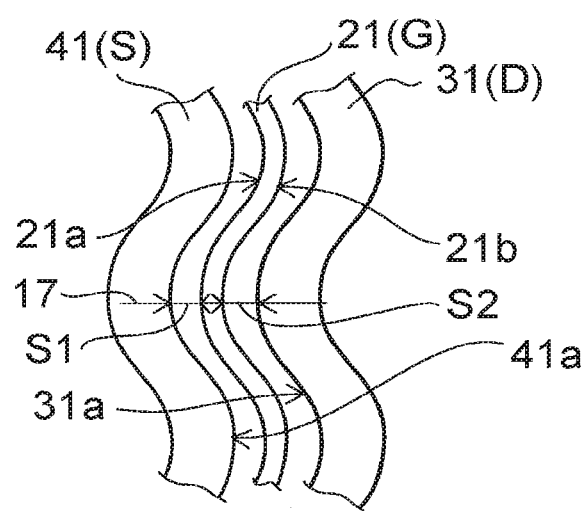
FIG. 7B is a partial enlarged schematic plan view.

FIG. 7A is a schematic plan view of the bending gate part, the bending source part, and the bending drain part of the high frequency semiconductor device according to the second embodiment. FIG. 7B is a partial enlarged schematic plan view thereof.

Figure 8A:
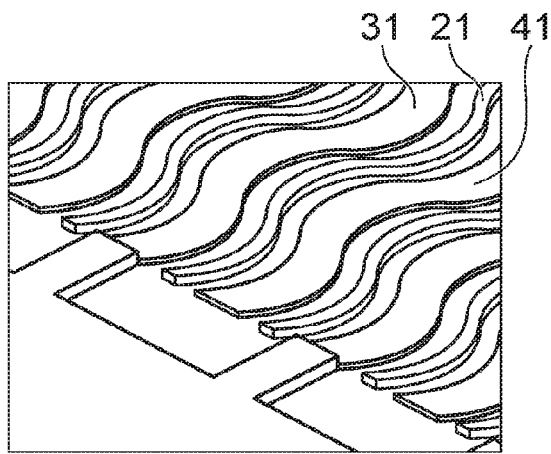
FIG. 8A is a partial enlarged schematic perspective view of a high frequency semiconductor device according to a second embodiment.
Figure 8B:
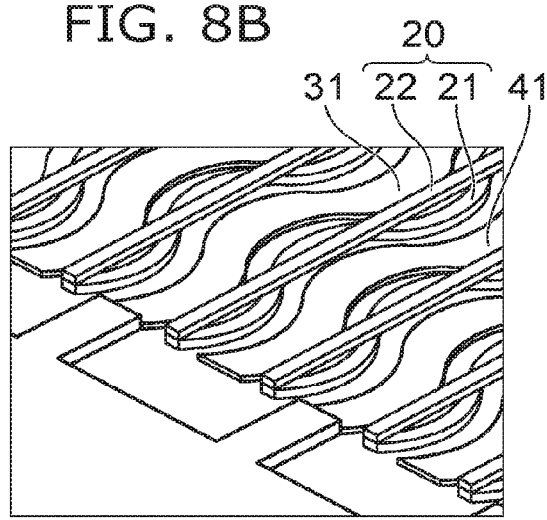
FIG. 8B is a partial enlarged schematic perspective view of the device with a straight gate part.
Figure 8C:
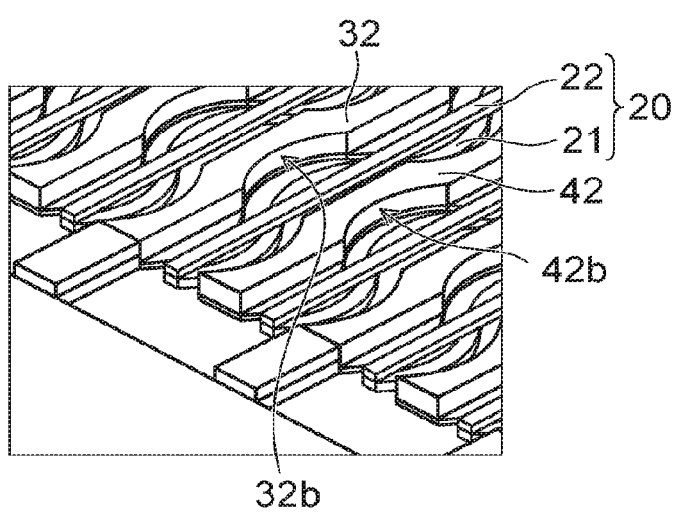
FIG. 8C is a partial enlarged schematic perspective view of the device with the recessed straight source part and a recessed straight part.
Figure 8D:
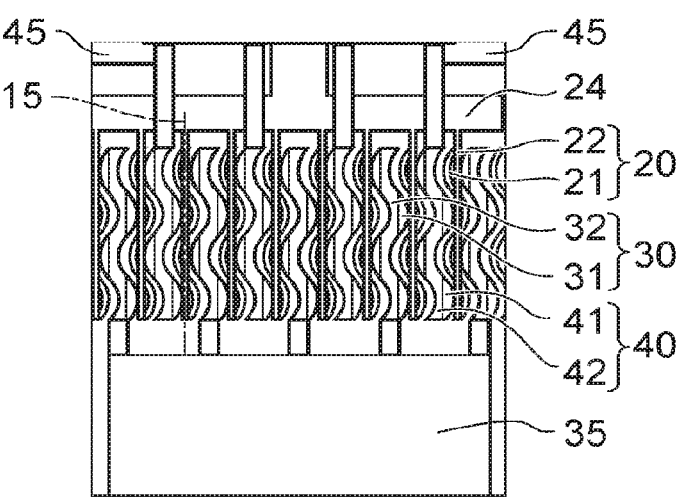
FIG. 8D is a plan view of the gate electrode, the source electrode, and the drain electrode.

FIG. 8A is a partial enlarged schematic perspective view of a high frequency semiconductor device according to a second embodiment. FIG. 8B is a partial enlarged schematic perspective view of the device with the straight gate part. FIG. 8C is a partial enlarged schematic perspective view of the device with the recessed straight source part and a recessed straight part. FIG. 8D is a plan view of the gate electrode, the source electrode, and the drain electrode.

Figure 9:
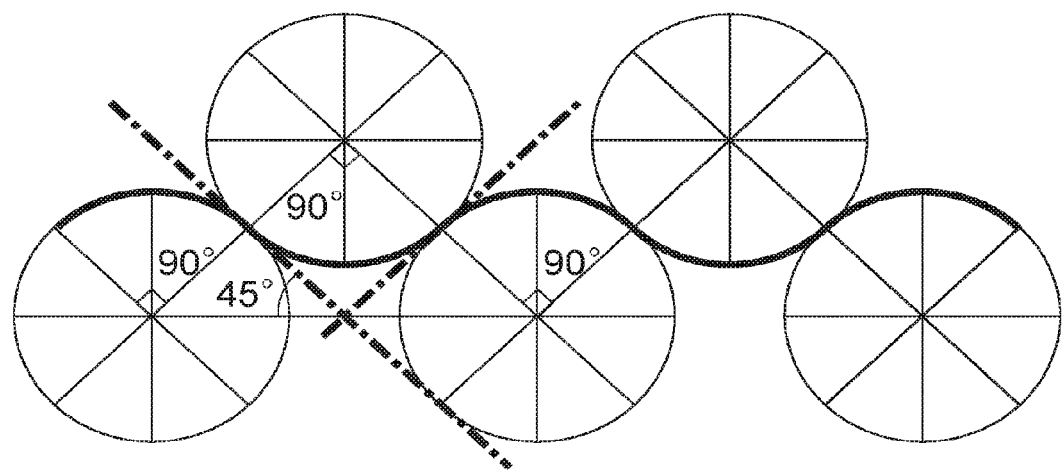
FIG. 9 is a schematic view describing the configuration of the bending gate part.

FIG. 9 is a schematic view describing the configuration of the bending gate part.

In the second embodiment, the bending gate part 21 is composed of circular rings. As shown in FIG. 9, the bending gate part 21 is placed along arcs arranged so that the tangents of the two adjacent circles cross each other at 90°. That is, as shown in FIG. 9, the bending gate part 21 consists of circular rings having a central angle of 90° in a zigzag shape so that the centers of the circles are arranged on opposite sides from each other.

The gate electrode 20 includes a bending gate part 21 and a straight gate part 22. The bending gate part 21 is extended on the surface 60a of the stacked body 60 and has a first outer edge 21a and a second outer edge 21b. The straight gate part 22 is extended on the surface of the bending gate part 21 along a first straight line 15.

The source electrode 40 includes a bending source part 41 and a straight source part 42. The bending source part 41 has an outer edge 41a spaced by a first distance S1 from the first outer edge 21a of the bending gate part 21 in the direction of the normal 17, as shown in FIG. 7B. The bending source part 41 is extended on the surface 60a of the stacked body 60. The straight source part 42 is extended on the surface of the bending source part 41 in parallel to the first straight line 15.

Recessed areas 42b are preferably formed on a side surface of the straight source part 42 to avoid contact between the zigzag-shaped bending gate part 21 and the straight source part 42. Or, as shown in FIG. 1B, conductive spacers 43 are preferably formed along the first straight line 15 using e.g. lifting technique between the straight source part 42 and the bending source part 41.

The drain electrode 30 includes a bending drain part 31 and a straight drain part 32. The bending drain part 31 has an outer edge 31a spaced by a second distance S2 from the second outer edge 21b of the bending gate part 21 in the direction of the normal 17, as shown in FIG. 7B. The bending drain part 31 is extended on the surface 60a of the stacked body 60. The straight drain part 32 is extended on the surface of the bending drain part 31 along the first straight line 15.

Recessed areas 32b are preferably formed on a side surface of the straight drain part 32 to avoid contact between the zigzag-shaped bending gate part 21 and the straight drain part 32. Or, as shown in FIG. 1B, conductive spacers 33 are preferably formed along the first straight line 15 using e.g. lifting technique between the straight drain part 32 and the bending drain part 31.

In the second embodiment, the gate width can be made approximately 1.1 times the straight gate width. This can increase the output power.

Figure 10:
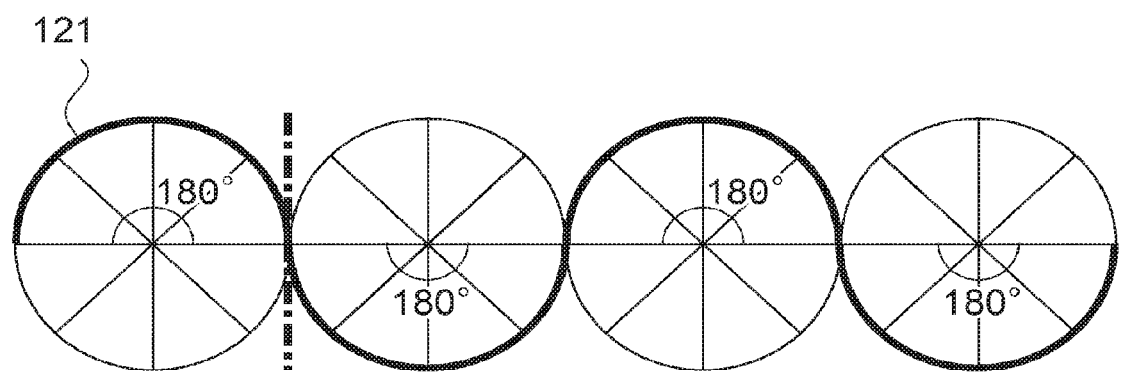
FIG. 10 is a schematic view describing a bending gate part according to a comparative example.

FIG. 10 is a schematic view describing a bending gate part according to a comparative example.

Arcs having a central angle of 180° can be arranged in a zigzag shape by linearly arranging circles in contact with each other. However, it is difficult to place a source electrode and a drain electrode in parallel. Thus, the bending gate part 121 cannot be extended in a zigzag shape along the first straight line as shown in FIG. 6B.

The first and second embodiments and the variations associated therewith can increase the gate width while suppressing the increase of gate resistance and the phase shift increase of the finger electrode. This can provide a high frequency semiconductor device capable of achieving high output power while maintaining high gain. Such a high frequency semiconductor device can be widely used in radar devices and microwave communication equipment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A high frequency semiconductor device comprising:
a stacked body made of a compound semiconductor;
a gate electrode including a bending gate part and a straight gate part, the bending gate part being extended in a zigzag shape on a surface of the stacked body and having a first outer edge and a second outer edge on an opposite side of the first outer edge, and the straight gate part being extended on a surface of the bending gate part along a first straight line;

a source electrode including a bending source part and a straight source part, the bending source part having an outer edge spaced by a first distance from the first outer edge of the bending gate part along a normal direction and extended on the surface of the stacked body, and the straight source part being extended on a surface of the bending source part in parallel to the first straight line; and a drain electrode including a bending drain part and a straight drain part, the bending drain part having an outer edge spaced by a second distance from the second outer edge of the bending gate part along the normal direction and extended on the surface of the stacked body, and the straight drain part being extended on a surface of the bending drain part along the first straight line.

2. The device according to claim 1, wherein the bending gate part includes two straight regions crossing the first straight line in a zigzag shape and a curvilinear region provided between the two straight regions.

3. The device according to claim 2, further comprising:
a conductive spacer provided between the straight source part and the bending source part, and
a conductive spacer provided between the straight drain part and the bending drain part.

4. The device according to claim 2, wherein the curvilinear region includes an arc.

5. The device according to claim 4, wherein the arc has a central angle of 90°.

6. The device according to claim 1, wherein the bending gate part consists of arcs extended in a zigzag shape.

7. The device according to claim 6, further comprising:
recessed areas formed on a side surface of the straight source part, and
recessed areas formed on a side surface of the straight drain part.

8. The device according to claim 6, further comprising:
a conductive spacer provided between the straight source part and the bending source part, and
a conductive spacer provided between the straight drain part and the bending drain part.

9. The device according to claim 6, wherein the arc has a central angle of 90°.

10. The device according to claim 1, wherein the compound semiconductor includes a GaN-based material or an AlGaAs-based material.

11. The device according to claim 10, further comprising:
a substrate; and
a rear surface conductor provided on a rear surface of the substrate,
the source electrode being connected the rear surface conductor.

* * * * *